US 6,381,719 B1

(12) United States Patent
Scheck

(10) Patent No.: US 6,381,719 B1
(45) Date of Patent: Apr. 30, 2002

(54) SYSTEM AND METHOD FOR REDUCING CLOCK SKEW SENSITIVITY OF A SHIFT REGISTER

(75) Inventor: Werner Scheck, Forstinning (DE)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/066,100

(22) Filed: Apr. 23, 1998

(51) Int. Cl.[7] ................................................ G06F 11/00
(52) U.S. Cl. ........................................ 714/727; 714/731
(58) Field of Search ................................. 714/727, 724, 714/731, 815

(56) References Cited

U.S. PATENT DOCUMENTS 5,721,740 A * 2/1998 Moon et al. ................. 714/731
5,793,777 A * 8/1998 Kundu ........................ 714/724
5,878,055 A * 3/1999 Allen .......................... 714/744
5,909,451 A * 6/1999 Lach et al. .................. 714/726

* cited by examiner

Primary Examiner—Phung M. Chung

(57) ABSTRACT

The system and method of the present invention for reducing the clock skew sensitivity of a shift register provides a control circuit for generating a clock signal to the first cell of the shift register. The first cell of the shift register receives the clock signal at its input and delays the clock signal for a specified time before transmitting the clock signal to the last cell in the shift register. The clock signal is propagated from the first cell of the shift register to the last cell of the shift register in a first direction. A test data circuit line is coupled to the last cell of the shift register. A test data signal is transmitted by the test data circuit line to the last cell of the shift register and is propagated through the shift register in a second direction, wherein the second direction is in a direction opposite from the direction of the clock signal. Thus, the clock signal is propagated through the cells in the shift register against the flow of the test data signal through the shift register.

18 Claims, 8 Drawing Sheets

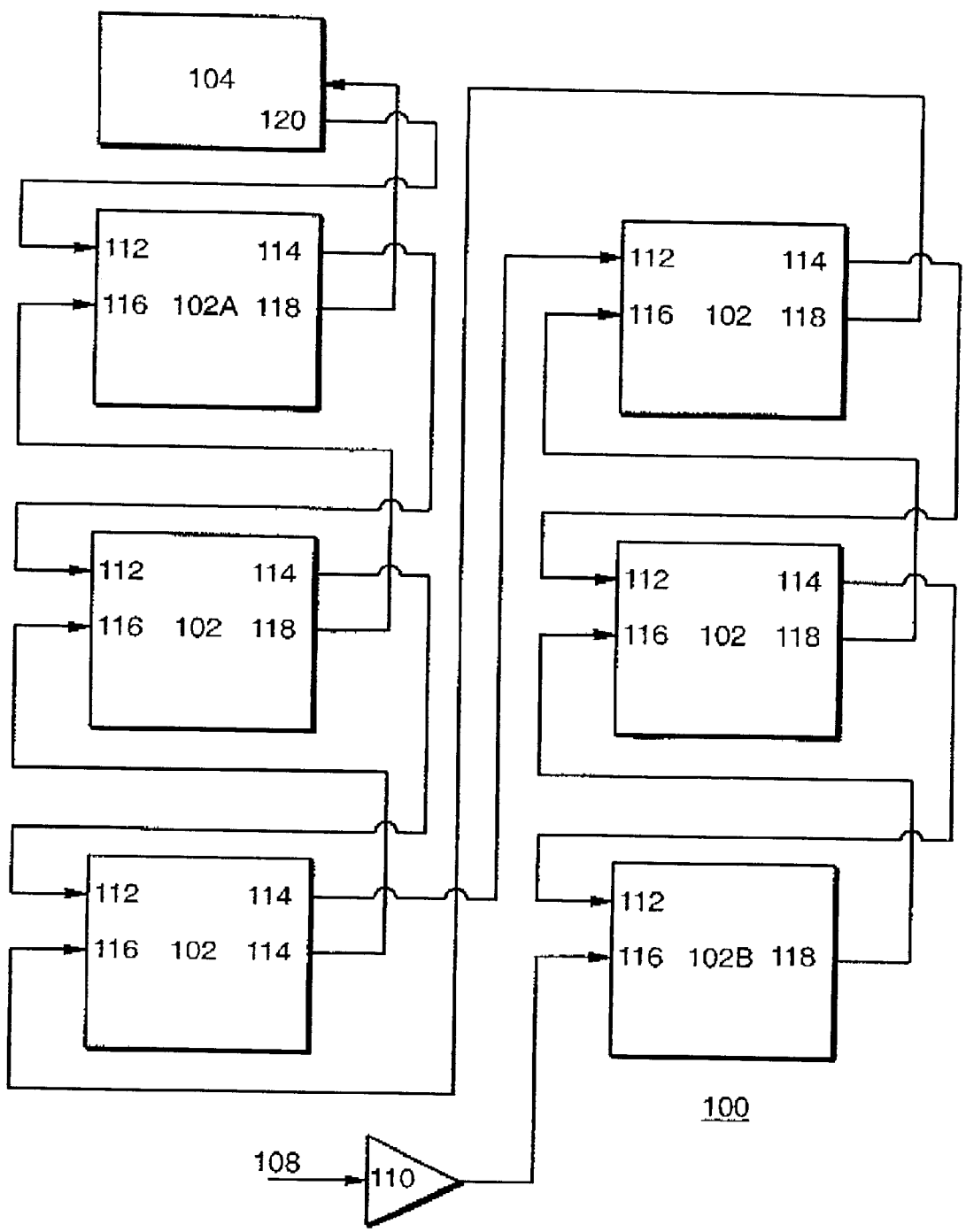
FIG._1

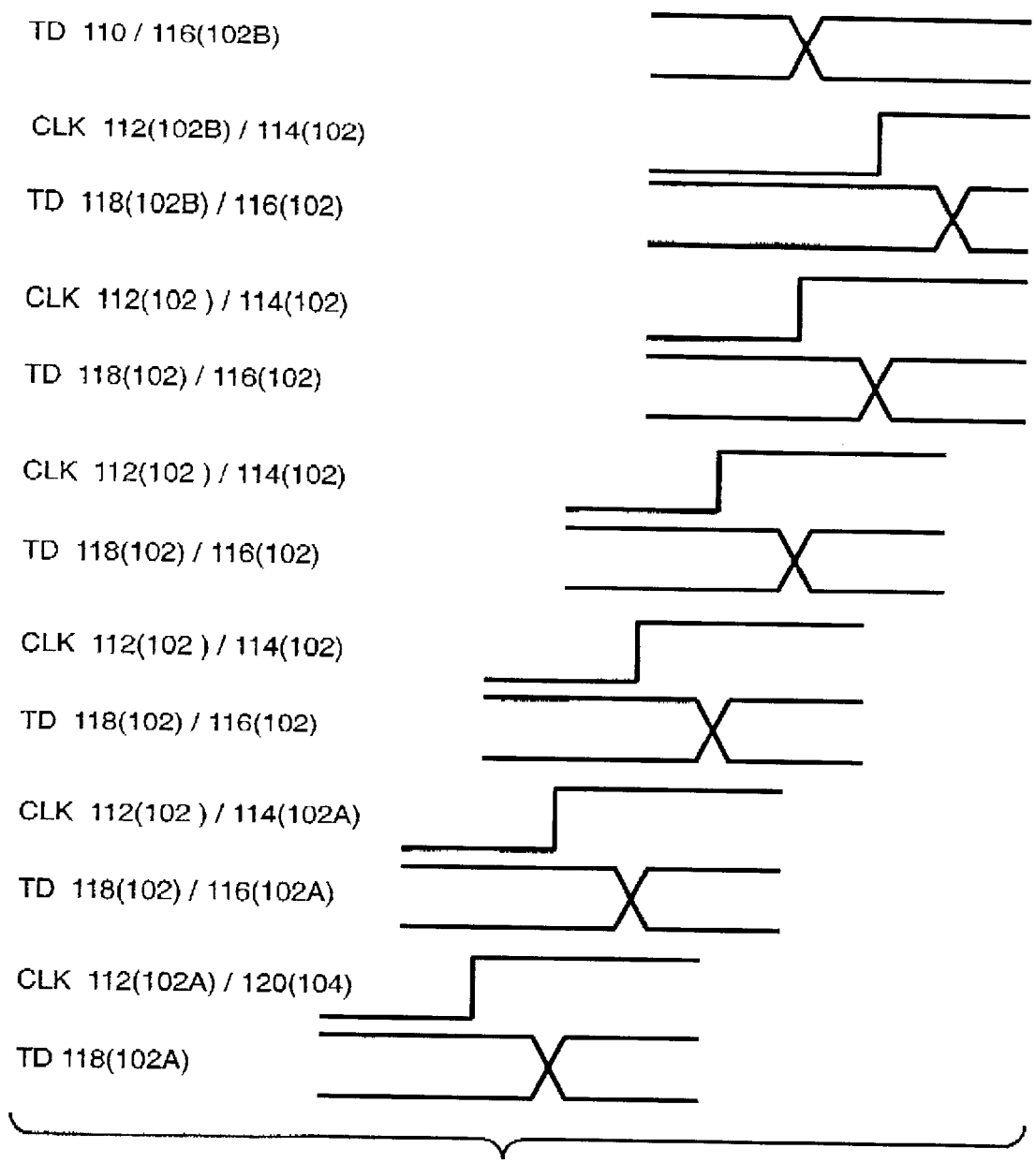
FIG._2

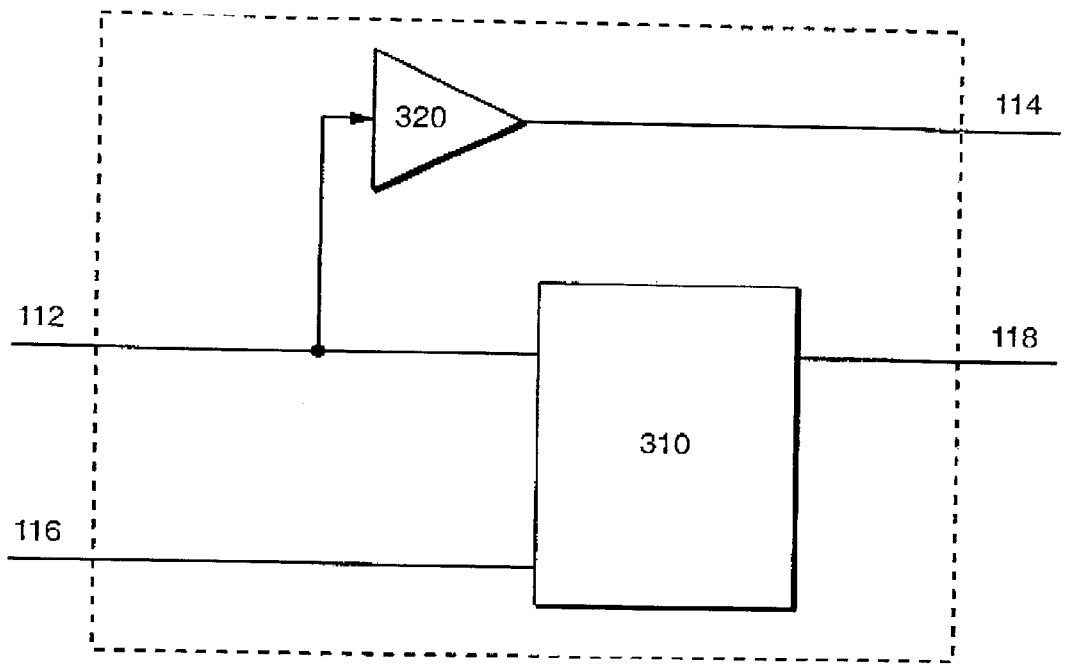
FIG._3
Table 1: Details on implementation example
| | |
|---|---|
| Technology: | LCB500K |
| Diesize: | 11.9 mm x 11.9 mm |
| Number of BS cells: | 180 |
| Number of inputs: | 50 |
| Number of outputs: | 58 |
| Number of bidirects: | 82 |
| Total Number of cell units: | 1013468 / 1014188*) |
*) original cell units pre-layout / cell units incl. 1clkbuf1a pre-layout
FIG._5

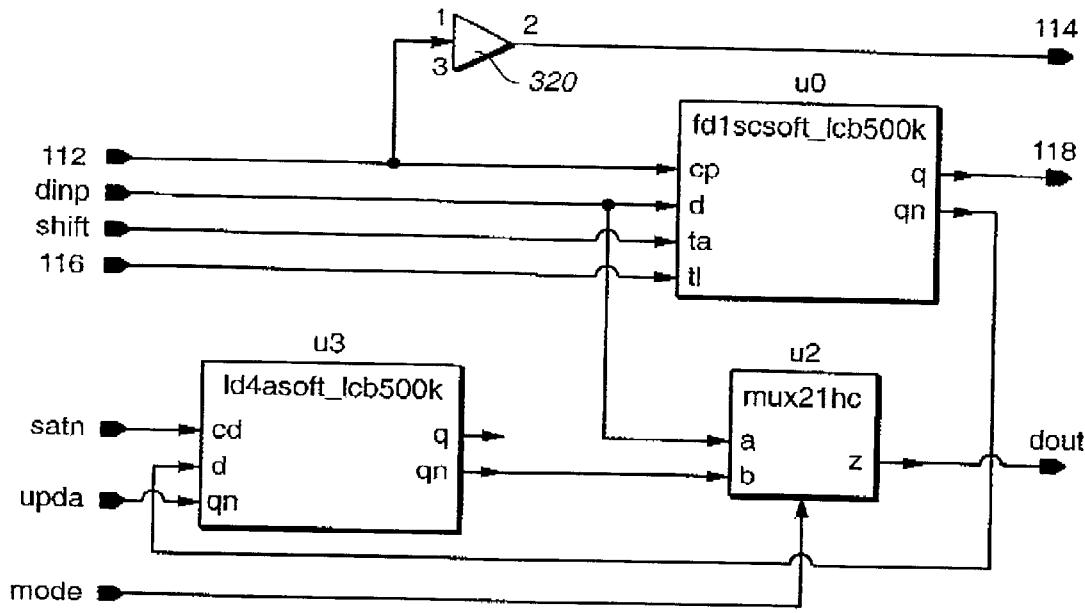
FIG._4A
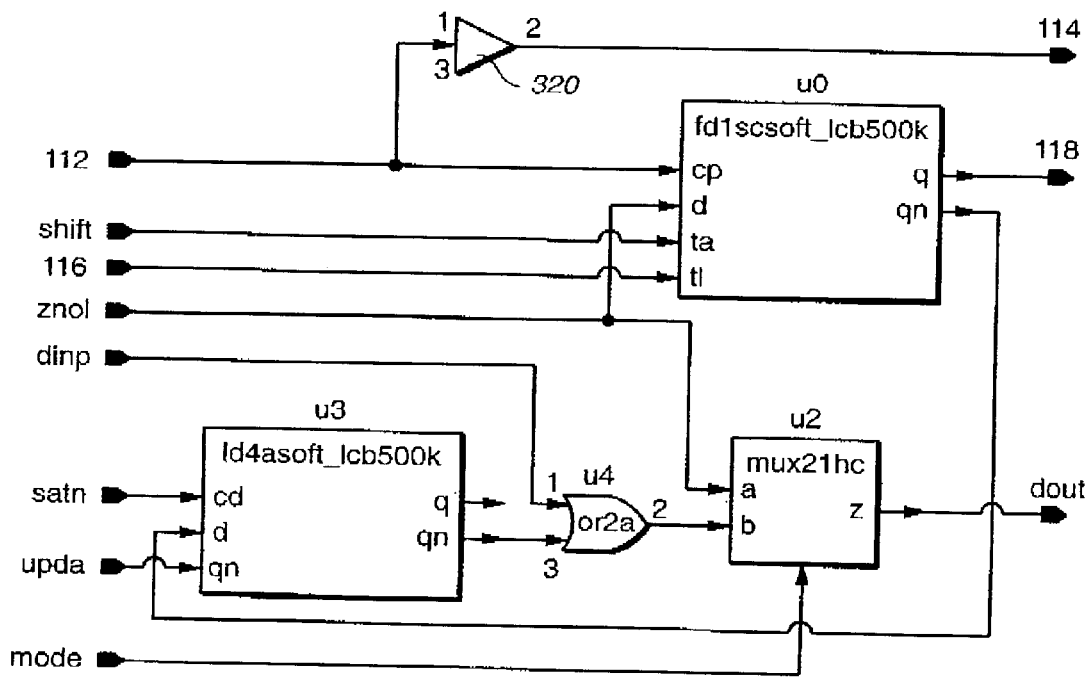
FIG._4B

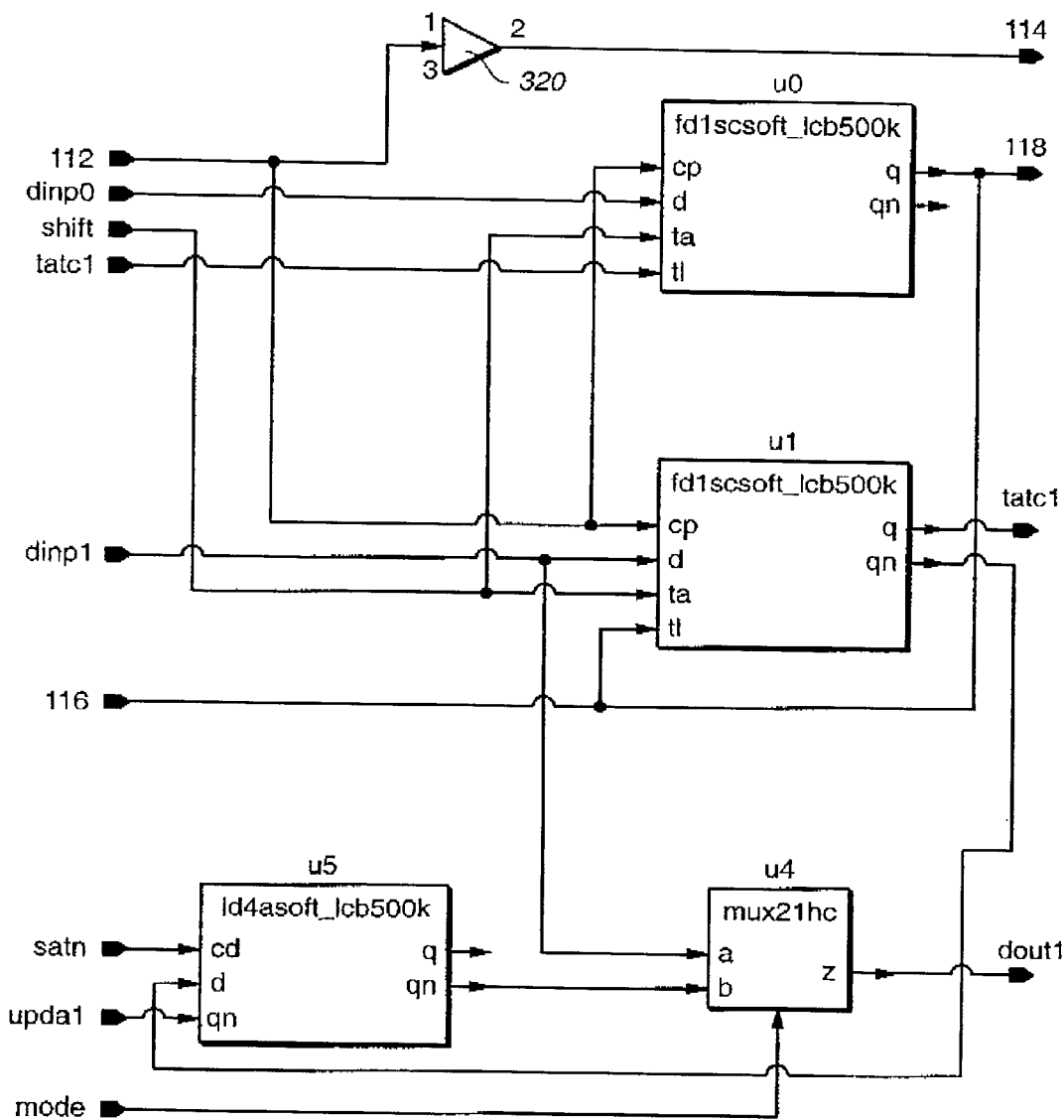
FIG._4C best-case industrial

| Version | ΔT post (pre) | frequency post (pre) |
|---|---|---|
| 1 | 25.06 ns / 29.03 ns (32.90 ns / 34.85 ns) | 21.3 MHz (15.7 MHz) |
| 2 | 20.20 ns / 24.35 ns (23.23 ns / 26.86 ns) | 26.8 MHz (22.5 MHz) |
| 3 | 25.08 ns / 23.23 ns (33.00 ns / 29.37 ns) | 21.3 MHz (15.6 MHz) | nominal

| Version | ΔT post (pre) | frequency post (pre) |
|---|---|---|
| 1 | 34.22 ns / 39.72 ns (45.41 ns / 48.21 ns) | 15.5 MHz (11.4 MHz) |
| 2 | 27.55 ns / 33.12 ns (32.18 ns / 37.56 ns) | 19.6 MHz (16.3 MHz) |
| 3 | 34.12 ns / 31.17 ns (44.60 ns / 39.39 ns) | 15.6 MHz (11.6 MHz) | worst-case industrial

| Version | ΔT post (pre) | frequency post (pre) |
|---|---|---|
| 1 | 47.03 ns / 54.54 ns (62.25 ns / 66.02 ns) | 11.3 MHz (8.3 MHz) |
| 2 | 37.75 ns / 45.72 ns (43.84 ns / 50.97 ns) | 14.2 MHz (12.0 MHz) |
| 3 | 46.93 ns / 43.06 ns (61.47 ns / 54.38 ns) | 11.3 MHz (8.4 MHz) | worst-case industrial 125 degrees

| Version | ΔT post (pre) | frequency post (pre) |
|---|---|---|
| 1 | 50.63 ns / 58.53 ns (68.74 ns / 71.41 ns) | 10.5 MHz (7.5 MHz) |
| 2 | 40.76 ns / 49.12 ns (47.44 ns / 54.66 ns) | 13.2 MHz (11.0 MHz) |
| 3 | 50.41 ns / 46.11 ns (65.84 ns / 58.06 ns) | 10.5 MHz (7.9 MHz) |

*FIG._6*

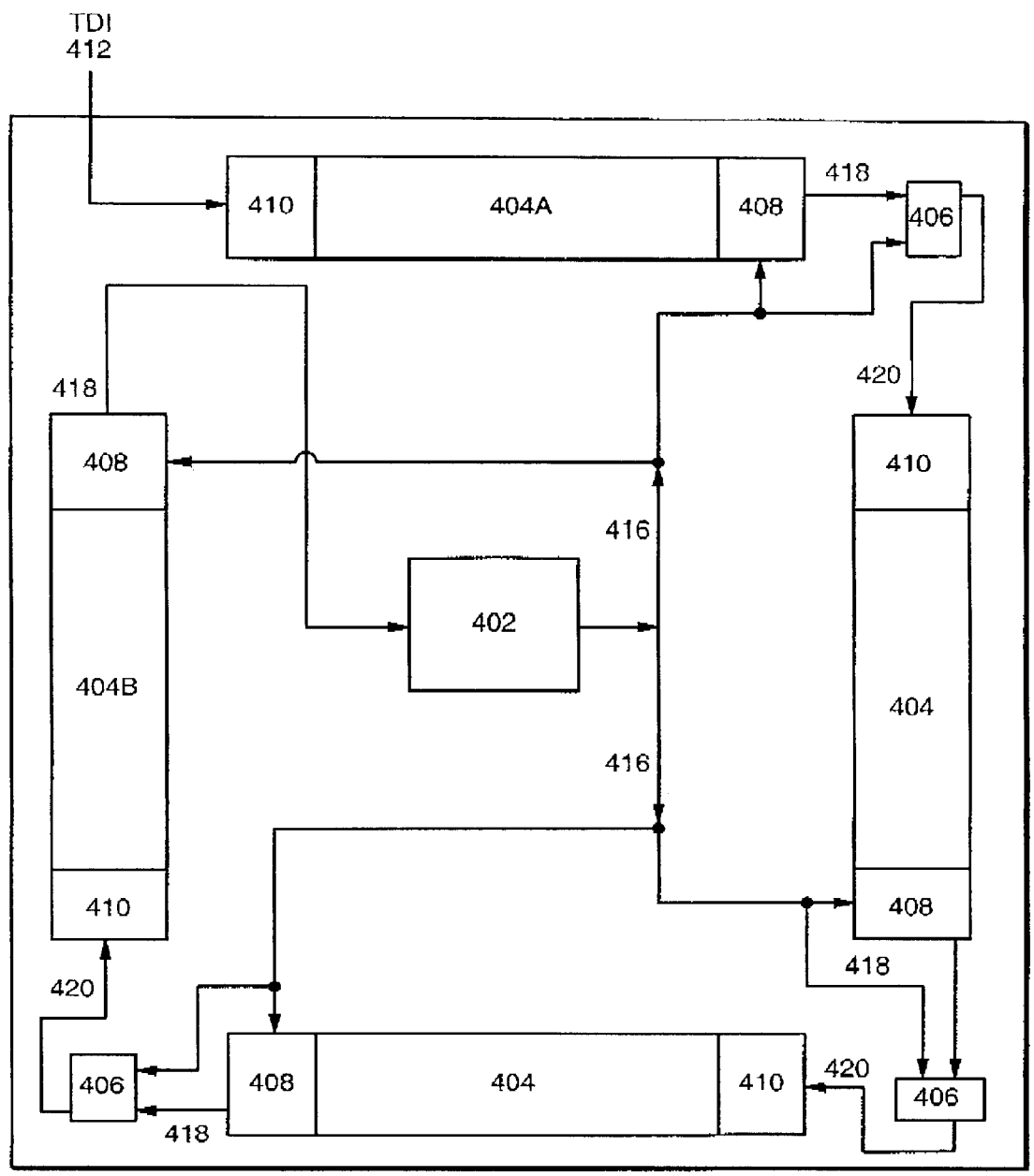
FIG._7

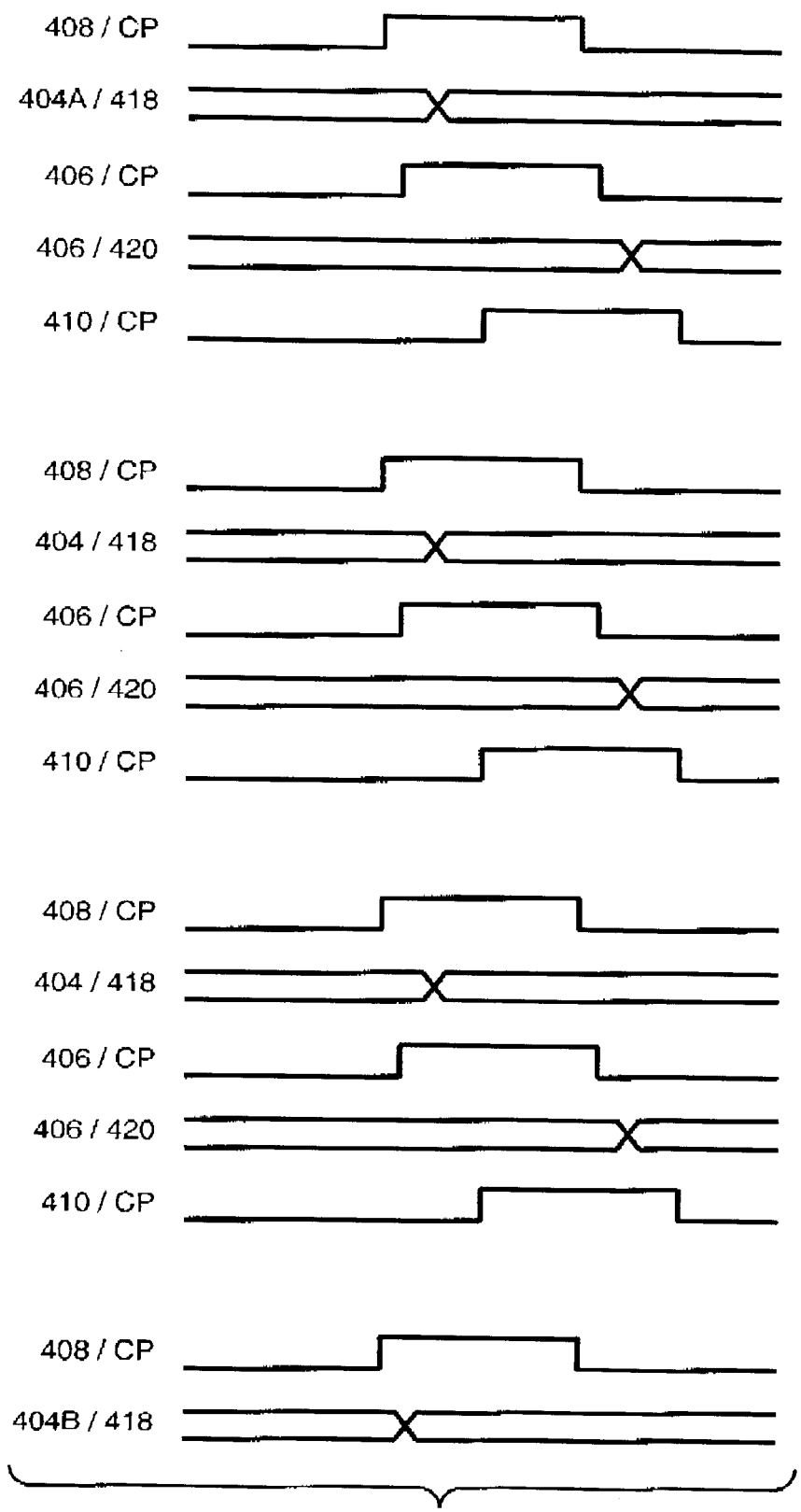
FIG._8

SYSTEM AND METHOD FOR REDUCING CLOCK SKEW SENSITIVITY OF A SHIFT REGISTER

FIELD OF THE INVENTION

The present invention relates generally to a clocking scheme for digital circuits, and more particularly, to a clocking scheme for reducing the clock skew sensitivity of a shift register.

BACKGROUND OF THE INVENTION

Shift registers are well known in the construction of digital circuits. A basic shift register structure comprises a series of flip flops having a common clock input where the output of one flip flop is coupled to the input of the next flip flop. Each flip flop in the shift register has setup time and hold time requirements which define a forbidden zone of the active clock edge, i.e. clock skew, to ensure the correct function of the shift register. In order for a shift register to function properly, the clock skew between a transmitting and a receiving flip flop in a shift register must be less than the intrinsic delay of the transmitting flip flop minus the hold time of the receiving flip flop.

One particular use of such shift registers is for boundary-scan testing, otherwise known as Joint Test Action Group (JTAG). Boundary-scan testing is a non-intrusive method for testing interconnects on printed circuit boards that is implemented at the integrated circuit level. Since its adoption by IEEE as Standard 1149.1, boundary-scan testing has been applied in high volume to high-end consumer products, telecommunication products, defense systems, peripherals, computers and avionics. Current JTAG implementations utilize boundary scan cells coupled to each other so that the cells function as a shift register, and thus are very sensitive to clock skew. A Test Access Port (TAP) controller generates all required control signals for the boundary scan cells including the clock signal. The conventional JTAG clocking scheme routes the JTAG clock as one signal net. However, boundary scan cells need to be placed close to the input or output cell to which it belongs and are therefore distributed along the sides of the die. This distribution causes long net delays which can result in a high skew on a clock net.

As the intrinsic delay in fast sub-micron technologies becomes smaller, it becomes more difficult to achieve the requirements for clock skew. As a result, the use of shift registers in digital circuits, such as for boundary-scan testing, becomes more difficult to implement and increases the effort required during layout resulting in many additional days to complete the layout. Moreover, in some cases it is impossible to achieve the minimum skew required for a secure shift operation of the shift registers. One typical example is a design with several hardmacros (i.e. logic functions with fixed layout, for example Random Access Memories (RAMs)). Ideally, hardmacros should be placed close to the Input/Output (I/O) region of the die in order to easily connect the power rings of the hardmacros to the power rings in the I/O area. This arrangement, however, interferes with the requirement that the boundary scan cells be placed close to the I/O region. For critical outputs (i.e. signals where the delay needs to be as small as possible) the boundary scan cell needs to be placed right next to the output buffer between the I/O area and the hardmacro. This configuration causes big skew on the clock skew since the layout tools can only control the clock skew effectively if there is no blocking area between the clock trunk (placed in the middle of the die) and the flip flop. Because the wire is too long, the skew needs to be balanced manually by slowing down the delay of the other flip flops using balance cells.

SUMMARY OF THE INVENTION

In accordance with the present invention, a system and method for a clocking scheme is implemented to reduce the clock skew sensitivity of a shift register. The system of the present invention advantageously transmits a clock signal through the cells in a shift register in a direction which is against the direction of the data flow of the shift registers. To ensure that the hold time of each cell of the shift register is adequate, a delay circuit is provided in each cell of the shift register to delay the clock signal before transmitting it to the next cell of the shift register. The clocking scheme of the present invention advantageously reduces the sensitivity of the shift register to clock skew and is easy and fast to implement in layout.

The system of the present invention comprises a control circuit, and a first cell and a last cell of the shift register. The control circuit generates a clock signal to the first cell of the shift register. The first cell of the shift register contains a delay circuit for delaying the clock signal before transmitting the clock signal to the next cell of the shift register. The clock signal is continuously delayed by each cell of the shift register as it is transmitted from the first cell to the last cell of the shift register and through the cells of the shift register. The shift register may contain any number of cells, where each cell contains a delay circuit for delaying the clock signal before transmitting it to the next cell in the register. At the same time that the clock signal is transmitted to the first cell of the shift register, a test data circuit line transmits data to the last cell in the shift register. The data is received by the last cell of the shift register and is transmitted through the cells of the shift register in a direction which is against the direction of the clock signal. The present invention also includes a method for reducing the clock skew sensitivity of a shift register. The method includes the steps of generating and transmitting a clocked signal to the first cell of a shift register in a first direction; receiving at the first cell the generated clock signal, delaying the clock signal in the first cell by means of a delay circuit, and transmitting the clock signal to the next cell of the shift register. The method also requires transmitting data to the last cell of a shift register in a second direction which is in the opposite direction of the first direction.

DESCRIPTION OF THE DRAWINGS

FIG. 1 is a block diagram of a shift register clocking system embodying the principles of the present invention.

FIG. 2 is a timing diagram of a clock signal and the data flow of a shift register clocking system in accordance with the present invention.

FIG. 3 is a block diagram of one embodiment of a shift register cell in accordance with the present invention.

FIGS. 4A–4C are block diagrams of other embodiments of boundary scan cells in accordance with the present invention.

FIG. 5 is a table summarizing the details of one embodiment implementing the present invention.

FIG. 6 is a table summarizing the results of using three different types of buffers in a boundary scan cell implementation embodying the principles of the present invention.

FIG. 7 is a block diagram of one embodiment of a clocking system for a plurality of shift registers in accordance with the present invention.

FIG. 8 is a timing diagram of a clock signal and the data flow of a plurality of shift registers in accordance with the present invention.

DESCRIPTION OF THE PREFERRED EMBODIMENT

FIG. 1 is a block diagram of a shift register clocking system 100 in accordance with the present invention. System 100 comprises a plurality of cells 102, a control circuit 104, a test data circuit input line 108, and a non-inverting buffer 110. A clock signal input line 112, a clock signal output line 114, a test data input line 116, and a test data output line 118 are coupled to each cell 102. Cells 102 may also include other input and output lines coupled to cell 102 which are not shown here for simplification purposes but would be evident to one skilled in the art when coupling individual cells as a shift register. Cells 102 are flip flops having an internal delay circuit for delaying the input clock signal from clock signal input line 112. The operation and configuration of cell 102 is described below in more detail with reference to FIG. 3. Cells 102 are coupled to one another as shown in FIG. 1 to form a shift register, and in a preferred embodiment of the present invention are boundary scan cells for a JTAG implementation. More specifically, system 100 comprises a first cell 102A and a last cell 102B. System 100 may also contain any number of intermediary cells 102 coupled to one another and to first cell 102A and last cell 102B to form a shift register as shown in FIG. 1. Cells 102A, 102B, and intermediary cells 102 are coupled to each other such that the clock signal output line 114 of one cell 102 is coupled to the clock signal input line 112 of the next cell 102, and the test data input line 116 of one cell 102 is coupled to the test data output line 118 of the next cell 102.

Control circuit 104 is coupled through a clock signal generator line 120 to the clock signal input line 112 of the first cell 102A. The control circuit 104 is also coupled through the test data output line 118 to the first cell 102A. Control circuit 104 may be any type of conventional control circuit which generates control signals, including a clock signal, to first cell 102A of the shift register. In a preferred embodiment of the present invention, control circuit 104 is a Test Access Port (TAP) controller for generating control signals for the boundary scan cells in a JTAG implementation. Because control circuit 104 only clocks first cell 102A, the driving strength of the driving buffer can be reduced from a dedicated clock buffer to a normal non-inverting buffer. One advantage of this configuration is its flexibility and easy implementation. A dedicated clock buffer consists of large transistors which are only available in the I/O ring of the die thus requiring long routing to connect control circuit 104 to the buffer and to drive all 102 cells using big clock trunks. As a result, conventional systems require additional layout steps for implementation and results in wasted silicon area are on the die. Systems embodying the principles of the present invention, however, enable a shortened connection between control circuit 104 and first cell 102A which can be routed automatically in layout.

In a preferred embodiment, the present invention is a JTAG implementation. In such an embodiment, test data input line 116 is coupled to the test data circuit input (TDI) pin of the JTAG. Test data circuit input line (TDI) 108 is coupled to a buffer 110 which in turn is coupled to test data input line 116 of last cell 102B in the shift register. In a preferred embodiment, TDI 108 is the data input of the JTAG implementation for all values that need to be loaded either in the boundary scan cells or TAP controllers. Buffer 110, which is a conventional buffer and preferably, a non-inverting buffer, is usually used to supply the required driving strength since the routing from TDI 108 to last cell 102B may be quite long.

During operation of system 100, the clock signal generated by control circuit 104 flows in a direction opposite to the direction of the data flow transmitted by TDI 108. Control circuit 104 transmits a clock signal along clock signal generator line 120 to first cell 102A. First cell 102A receives the clock signal at clock signal input line 112. First cell 102A delays the clock signal for a specified amount of time and then transmits the clock signal along the clock signal output line 114 to last cell 102B. If system 100 comprises a plurality of intermediary cells 102 coupled to 102A and 102B, then first cell 102A delays the clock signal for a specified amount of time and then transmits the clock signal along clock signal output line 114 to the next intermediary cell 102 in the shift register. The signal is then propagated through intermediary cells 102 of the shift register until the clock signal reaches last cell 102B in the shift register. At the same time that control circuit 104 transmits a clock signal along clock signal generator line 120 to first cell 102A, TDI 108 transmits a test data signal along test data input line 116 to last cell 102B of the shift register. Last cell 102B of the shift register then transmits the test data signal along the test data output line 118 to first cell 102A. If system 100 comprises a plurality of intermediary cells 102 coupled to 102A and 102B, then last cell 102B transmits the test data signal along the test data output line 118 to the next intermediary cell 102 in the shift register. Next intermediary cell 102 receives the test signal data at test data input line 116 and transmits the test signal data along the test data output line 118 to the next intermediary cell 102. The signal is then propagated through intermediary cells 102 of the shift register until the test data signal reaches first cell 102A in the shift register. From first cell 102A of the shift register, the test signal data is transmitted along test data output line 118 to control circuit 104. FIG. 2 shows a timing diagram of the clock signal and test data signal for system 100 in accordance with the present invention.

FIG. 3 shows a block diagram of one embodiment of a cell 102 in accordance with the present invention. Cell 102 is preferably a boundary scan cell and comprises a flip flop 310 coupled through the clock signal input line 112 to a delay circuit 320. The clock signal output line 114 is also coupled to the delay circuit 320. Delay circuit 320 is directly inserted in each cell 102. Cell 102 may include other input and output lines which are not shown but which would be obvious to one skilled in the art. In a preferred embodiment of the present invention, delay circuit 320 is a non-inverting buffer. The present invention ensures that the shift operation operates correctly as long as the intrinsic delay of delay circuit 320 for the clock signal is longer than the intrinsic delay of the flip flop 310 of the previous cell itself. FIGS. 4A–4C are other examples of cells 102 embodying the principles of the present invention. The cells 102 in FIGS. 4A–4C are conventional boundary scan cells with a delay circuit 320 inserted directly into each boundary scan cell. Each cell 102 also includes a clock signal input line 112, a clock signal output line 114, a test data input line 116, and a test data output line 118. Cells 102 in FIGS. 4A–4C also include other input and output lines coupled to cells 102 and/or within cells 102 which are not shown here for simplification purposes but would be evident to one skilled in the art.

In a preferred embodiment, the present invention is implemented in an existing design using LCB500K technology which already contains JTAG inserted by JTAG builder. Cells 102 are boundary scan cells and are preferably the boundary scan cells as illustrated in FIG. 4A. Referring now to FIG. 5, a table summarizing the details of a preferred embodiment is shown. In such an embodiment, the die size is approximately 11.9 mm by 11.9 mm with 180 boundary scan cells, 50 inputs, 58 outputs and 52 bidirects. The embodiment represents an average size of a state-of-the-art design. In this particular embodiment, the number of boundary scan cells is smaller than the total number of inputs/outputs because not all inputs and output were included into JTAG. Referring now to FIG. 6, a table summarizing the performance of the preferred embodiment using three different buffers 320 to delay the clock signal. Version 1 uses a lclkbuf1 buffer, version 2 uses a lclkbuf3a buffer, and version 3 uses two serial inverters n1b. The second column of FIG. 6 shows the delay on the JTAG clock measured from the first boundary scan cell clocked directly by the TAP controller to the last boundary scan cell at the end of the clock chain. The values inside brackets are based on pre-layout c-MDE delay calculation, and the values without brackets are based on actual layout information. The third column of FIG. 6 gives an approximate frequency for which the JTAG will still run. For this estimation, a 50% duty cycle of the external clock is assumed. The maximum frequency is determined by the delay of the JTAG clock along the clock chain and the control signals of the TAP controller derived from the negative clock edge of the external clock. For calculating the frequencies shown in FIG. 6, the path of the shift signal to the last boundary scan cell with the longest clock delay was taken. As seen in FIG. 6, the best results can be achieved by using lclkbuf3a as the delay buffer for delay circuit 320 in cell 102.

FIG. 7 shows another embodiment of a system 400 in accordance with the present invention. System 400 comprises a control circuit 402, a first shift register 404A, a last shift register 404B, and a plurality of data lockup latches 406. System 400 may also contain any number of intermediary shift registers 404 coupled to one another in between first shift register 404A and last shift register 404B to form a chain of shift registers as shown in FIG. 7. Each shift register (404A, 404B, and 404) may comprise any number of cells 102 (not shown) coupled to each other as a shift register and includes at least a first cell 408 and a last cell 410. Control circuit 402 may be any type of conventional control circuit which generates control signals to first shift register 404A, last shift register 404B including a clock signal, and any intermediary shift register 404 in system 400. In a preferred embodiment of the present invention, control circuit 402 is a Test Access Port (TAP) controller for generating control signals for the boundary scan cells in a JTAG implementation. Data lockup latches 406 are conventional data lockup latches and are generally used to ensure correct capturing of data of the shift register if the clock of the receiving flip flop of the shift register is slower than the clock of the sending flip flop of the shift register. A data lockup latch in front of the data input of the receiving flip flop of the shift register ensure correct functionality by allowing data to pass only during a low clock signal. A test data circuit input line (TDI) 412 is coupled to the last cell 410 in the first shift register 404A. A clock signal generator line 416 is coupled to each shift register 404. More specifically, control circuit 402 is coupled through the clock signal generator line 416 to the first cell 408 of each shift register 404 and to each data lockup latch 406. The data lockup latches 406 are coupled through the test data output lines 418 to the first cells 408 of each shift register 404 except for the first cell 408 of the last shift register 404B. The data lockup latches 406 are also coupled through the test data input lines 420 to the last cells 410 of each shift register 404 except for the last cell 410 of the first shift register 404A.

During operation, control circuit 402 generates and transmits a clock signal along the clock signal generator line 416 to the first cell 408 of each shift register 404, 404A and 404B. The clock signal is propagated through the cells 102 of the shift register from the first cell 408 to the last cell 410 of the shift register. At the same time that control circuit 402 generates and transmits a clock signal to the first cell 408 of each shift register 404, 404A, and 404B, TDI line 412 transmits a test data signal from a test circuit to the last cell 410 of the first shift register 404A. The test data signal is propagated through the cells 102 of the first shift register 404A and is transmitted from the first cell 408 along the test data output line 418 to the data lockup latch 406. The test data signal is then transmitted from the data lockup latch 406 to the last cell 410 of the last shift register 404B via test data input line 420. If system 400 comprises a plurality of intermediary shift registers 404 coupled in between 404A and 404B as shown in FIG. 7, then the data lockup latch 406 transmits the test data signal received from the first cell 408 of first shift register 404A to the last cell 410 of the next intermediary shift register 404 via test data input line 420. The signal is then propagated through cells 102 of intermediary shift register 404 until the test data signal reaches first cell 408 of the intermediary shift register 404. The test data signal is propagated through the shift registers 404 and data lockup latches 406 until the test data signal reaches the first cell 408 of last shift register 404B. The test data signal is then transmitted from first cell 408 of last shift register 404B to control circuit 402 via test data output line 418. FIG. 8 shows a timing diagram of the test data signal and the clock signal of system 400 in accordance with the present invention.

It is to be understood that the specific mechanisms and techniques which have been described are merely illustrative of certain applications of the principles of the invention. Numerous modifications may be made to the system and methods described without departing from the true spirit and scope of the invention.

What is claimed is:

1. A system for reducing the clock skew sensitivity of a shift register comprising:

a first cell, disposed at a first end of the shift register, the first cell having a clock input for receiving a clocked signal, a delay circuit for delaying the clocked signal, a clock output for transmitting a first delayed clocked signal, a test data input for receiving a test data signal, and a test data output for transmitting the test data signal;

a second cell disposed at a second end of the shift register, the second cell having a clock input for receiving the first delayed clocked signal, a delay circuit for delaying the first delayed clocked signal, a clock output for transmitting a second delayed clocked signal, a test data input for receiving a test data signal, and a test data output for transmitting the test data signal;

a control circuit for generating and transmitting the clocked signal to the first cell of the shift register, the control circuit having a test data input for receiving the test data signal transmitted by the first cell of the shift register.

2. The system as set forth in claim 1 wherein the delay circuit of the first cell and the second cell is a non-inverting buffer.

3. The system as set forth in claim 1 wherein the first cell and the second cell are boundary scan cells for JTAG implementations.

4. The system as set forth in claim 1 wherein the control circuit is a Test Access Port controller for JTAG implementations.

5. The system as set forth in claim 1 further comprising a plurality of cells coupled to the first cell and the second cell in order to form a shift register, each of the plurality of cells having a clock input for receiving a clocked signal, a delay circuit for delaying the clocked signal, a clock output for transmitting the delayed clocked signal, a test data input for receiving a test data signal, and a test data output for transmitting the test data signal.

6. The system as set forth in claim 1 wherein the clocked signal is propagated through the shift register in a first direction, and the test data signal is propagated through the shift register in a second direction, the second direction being in a direction opposite to the first direction.

7. A system for reducing the clock skew sensitivity of an integrated circuit comprising
 a plurality of cells coupled to one another as a shift register, each cell having a clock input for receiving a clocked signal, a delay circuit for delaying the clocked signal, a clock output for transmitting a delayed clocked signal, a test data input for receiving a test data signal, and a test data output for transmitting the test data signal;
 a control circuit for generating and transmitting a clocked signal to a first cell of the plurality of cells, the control circuit having a test data input for receiving the test data signal transmitted by the first cell of the plurality of cells.

8. The system as set forth in claim 7 wherein the clocked signal is propagated through the plurality of cells in a first direction and the test data signal is propagated through the plurality of cells in a second direction, the second direction being in a direction opposite to the first direction.

9. The system as set forth in claim 7 wherein the delay circuit of each cell is a non-inverting buffer.

10. The system as set forth in claim 7 wherein the plurality of cells are boundary scan cells for JTAG implementations.

11. The system as set forth in claim 7 wherein the control circuit is a Test Access Port controller for JTAG implementations.

12. A system for reducing clock skew sensitivity comprising:
 a first shift register comprising a plurality of boundary scan cells, the first shift register having a first boundary scan cell and a second boundary scan cell, each boundary scan cell having a clock input for receiving a clocked signal, an internal logic circuit for delaying the clocked signal, an output means for transmitting a delayed clock signal, a test data input for receiving a test data signal, and a test data output for transmitting the test data signal;
 a second shift register comprising a plurality of boundary scan cells, the second shift register having a first boundary scan cell and a second boundary scan cell, each boundary scan cell having a clock input for receiving a clocked signal, an internal logic circuit for delaying the clocked signal, an output means for transmitting a delayed clock signal, a test data input for receiving a test data signal, and a test data output for transmitting the test data signal;
 a data lockup latch coupled to the first and second shift register, the data lockup latch having a clock input for receiving a clocked signal, a data input for receiving the test data signal from the first boundary scan cell of the first shift register, and a test data output for transmitting the test data signal to the second boundary scan cell of the second shift register;
 a control circuit for generating a clocked signal to the first boundary scan cell of the first shift register and to the first boundary scan cell of the second shift register, the control circuit having a test data input for receiving the test data signal transmitted by the second boundary scan cell of the second shift register.

13. The system as set forth in claim 12 wherein the delay circuit of the boundary scan cells comprises a non-inverting buffer.

14. The system as set forth in claim 12 wherein the control circuit is a TAP controller for JTAG implementations.

15. The system as set forth in claim 12 wherein the clocked signal is propagated through the first shift register in a first direction and the test data signal is propagated through the shift register in a second direction, the second direction being in a direction opposite to the first direction.

16. An integrated circuit for reducing clock skew sensitivity comprising
 a plurality of shift registers, each shift register comprising a first boundary scan cell and a second boundary scan cell, each boundary scan cell having a clock input for receiving a clocked signal, an internal logic circuit for delaying the clocked signal, an output means for transmitting a delayed clock signal, a test data input for receiving a test data signal, and a test data output for transmitting the test data signal;
 a plurality of data lockup latches, each data lockup latch having a clock input for receiving a clocked signal, a test data input for receiving a test data signal, and a test data output for transmitting the test data signal; and
 a control circuit having a clock output for generating a clocked signal to the first boundary scan cell of each of the plurality of shift registers, the control circuit having a test data input for receiving a test data signal.

17. The circuit as set forth in claim 16 wherein the internal logic circuit of the boundary scan cell is a non-inverting buffer.

18. A method for reducing the clock skew sensitivity of a shift register having a first cell and a second cell, each cell having an internal logic circuit for delaying a clocked signal comprising:
 transmitting data to the shift register in a first direction;
 generating and transmitting a clocked signal to the first cell in a second direction, wherein the second direction is in the opposite direction of the first direction of the transmitted data flow;
 receiving at the first cell the generated clocked signal;
 delaying the clocked signal by means of the internal logic circuit located within the first cell and producing a delayed clocked signal; and
 transmitting the delayed clock signal from the first cell to the second cell.

* * * * *